(12) United States Patent
Hynes et al.

(10) Patent No.: US 7,326,932 B2
(45) Date of Patent: Feb. 5, 2008

(54) SENSOR AND CAP ARRANGEMENT

(75) Inventors: Eamon Hynes, Raheen (IE); Edward John Coyne, Athenry (IE); William A. Lane, Sraleigh, Waterfall (IE)

(73) Assignee: Analog Devices, Inc., Norwood, MA (US)

( * ) Notice: Subject to any disclaimer, the term of this patent is extended or adjusted under 35 U.S.C. 154(b) by 213 days.

(21) Appl. No.: 11/045,910

(22) Filed: Jan. 26, 2005

(65) Prior Publication Data

US 2006/0163453 A1    Jul. 27, 2006

(51) Int. Cl.
*G01J 5/02* (2006.01)
(52) U.S. Cl. ............ 250/353; 250/339.01; 250/339.02
(58) Field of Classification Search ............... 250/353, 250/352, 339.02, 339.01
See application file for complete search history.

(56) References Cited

U.S. PATENT DOCUMENTS

| | | | | |
|---|---|---|---|---|
| 4,994,664 A | * | 2/1991 | Veldkamp | 250/216 |
| 5,210,400 A | * | 5/1993 | Usami | 250/208.1 |
| 5,528,038 A | * | 6/1996 | Yoshiike et al. | 250/342 |
| 5,550,373 A | * | 8/1996 | Cole et al. | 250/338.1 |
| 5,567,942 A | * | 10/1996 | Lee et al. | 250/353 |
| 5,650,624 A | * | 7/1997 | Wong | 250/338.5 |
| 5,668,033 A | * | 9/1997 | Ohara et al. | 438/113 |
| 5,701,008 A | * | 12/1997 | Ray et al. | 250/352 |
| 5,914,488 A | * | 6/1999 | Sone | 250/338.1 |
| 6,222,454 B1 | | 4/2001 | Harling et al. | |
| 6,252,229 B1 | * | 6/2001 | Hays et al. | 250/338.4 |
| 6,504,155 B1 | * | 1/2003 | Ookawa | 250/352 |
| 2002/0175284 A1 | * | 11/2002 | Vilain | 250/338.1 |
| 2002/0191819 A1 | * | 12/2002 | Hashimoto et al. | 382/118 |
| 2003/0075794 A1 | | 4/2003 | Felton et al. | |
| 2003/0209893 A1 | * | 11/2003 | Breed et al. | 280/735 |
| 2004/0173751 A1 | * | 9/2004 | Komobuchi et al. | 250/338.1 |

FOREIGN PATENT DOCUMENTS

JP         200338389 A  * 12/2000
WO      WO 2006/07958     8/2006

OTHER PUBLICATIONS

International Search Report, PCT/EP2006,050174.
Mori, T. et al, "Vacuum-encapsulated thermistor bolometer type miniature infrared sensor", IEEE, Jan. 1994, pp. 257-262.

* cited by examiner

*Primary Examiner*—David Porta
*Assistant Examiner*—Casey Bryant
(74) *Attorney, Agent, or Firm*—Wolf, Greenfield & Sacks, P.C.

(57) ABSTRACT

The invention provides a sensor element formed in a first substrate and at least one optical element formed in a second substrate, the first and second substrates being configured relative to one another such that the second substrate forms a cap over the at least one sensor element, the at least one optical element being configured to guide incident radiation on the cap to the at least one sensor element.

21 Claims, 5 Drawing Sheets

SENSOR AND CAP ARRANGEMENT

FIELD OF THE INVENTION

The present invention relates sensors and in particular to a sensor formed from two substrates, the substrates being arranged relative to one another so as to provide a sensing element in one substrate and an optical element providing a cap above the sensing element formed in a second substrate.

BACKGROUND OF THE INVENTION

Sensors are well known in the art. When formed in a semiconductor material such as silicon or germanium such sensors may be provided as mechanical structures, for example as a MEMS arrangement, or electromagnetic (EM) radiation sensors such as infra-red (IR) sensors. By using materials such as silicon it is possible to form the sensor in one or more layers of the wafer from etching and other semiconductor processing techniques so as to result in a desired configuration. Due to the delicate nature of the sensors and their sensitivity to the surrounding environment it is known to provide a protective cap over the sensor, the cap serving to isolate the environment of the sensor from the ambient environment where the sensor is operable.

Within the area of EM sensors there is a specific need for sensors that can be provided in a packaged form.

SUMMARY OF THE INVENTION

Accordingly, a first embodiment of the invention provides an EM sensor including a sensing element provided in a first substrate and having a cap provided over the sensing element, the cap including an optical element formed therein, the optical element being configured to guide incident radiation on the cap to a selected portion of the sensing element below.

BRIEF DESCRIPTION OF THE DRAWINGS

The present invention will now be described with reference to the accompanying drawings in which.

DETAILED DESCRIPTION OF THE DRAWINGS

The invention will now be described with reference to FIGS. 1 to 6. Although the invention has application in any EM radiation sensing environment, for the ease of explanation it will now be described with reference to a preferred illustrative embodiment, that of a silicon wafer-based thermal radiation sensor.

Such sensors often contain delicate sensing membranes. The fragile nature of the membrane necessitates careful (with resultant cost repercussions) handling of the sensor after the membrane has been manufactured to prevent damage and yield loss. In addition, for membrane-based thermal radiation sensors, it is an advantage to package the sensor in a vacuum or other low pressure environment to eliminate heat loss from the absorbing membrane through gas convection and conduction. Finally, while many single point IR sensors do not use a focusing lens at all, it is an advantage in single point thermal sensors to be able to focus the incoming radiation onto a single sensitive point on the membrane to effectively amplify the signal. In the cases where single point IR sensors are using a lens, they generally use a refractive lens of a material with a suitable shape and refractive index, for example germanium or other similar material.

For imaging a thermal scene onto a sensor array to produce an infrared picture of the scene, the same requirements also apply with the additional requirement that focusing the beam (i.e., with a lens) is highly desirable to produce a focused image of the scene on the image plane of a sensor array.

The sensor of the present invention addresses these and other challenges described above by providing a device and method for capping the thermal sensor at the wafer level with a silicon cap. In accordance with the present invention a sensor device (or array of repeating sensor devices) is manufactured on one wafer substrate and a capping wafer is manufactured on a separate substrate. The capping wafer is joined to the sensor wafer and bonded to it under controlled ambient conditions, such as under vacuum conditions. This bonded wafer arrangement can be singulated or sawn into individual capped sensor chips for final packaging and sale. Such capping methodologies are well described in US Application No. 20030075794 of Felton et al which is assigned to the Assignee of the present invention, and the contents of which are incorporated herein by reference.

Figure 1:
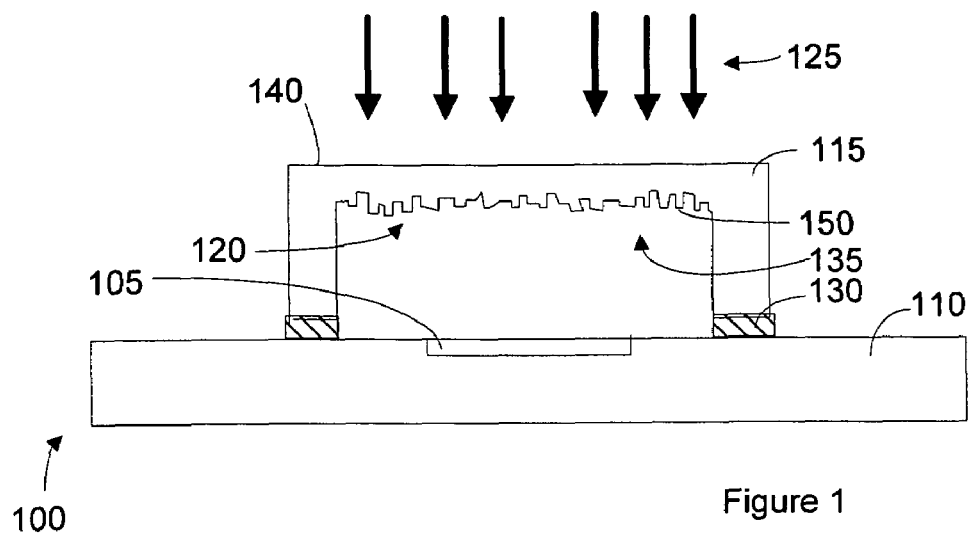
FIG. 1 is a cross section through an illustrative embodiment of a sensor for practicing the present invention.
Figure 2:
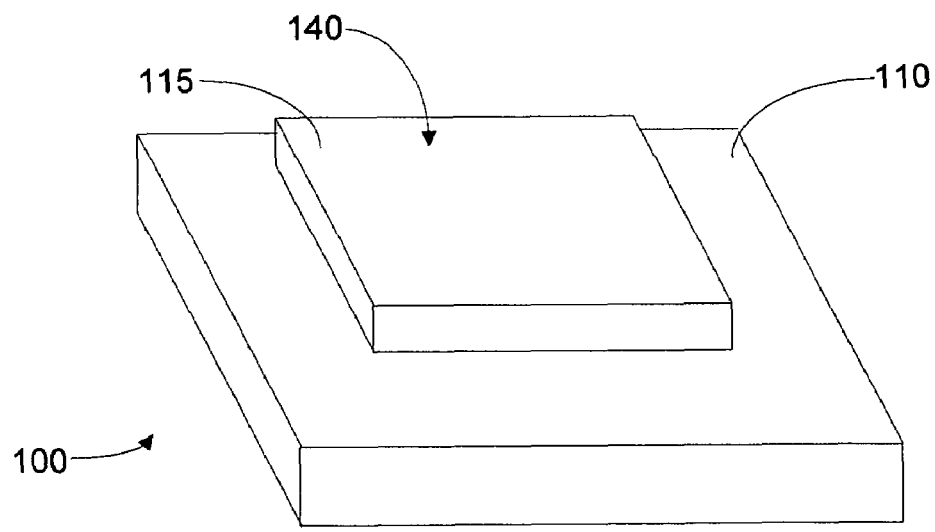
FIG. 2 is a perspective view from above of the sensor of FIG. 1.

FIG. 1 shows in cross section, such a sensor device 100. The device includes a sensing element 105 formed in a first silicon wafer 110 or what is sometimes called a sensor die. A cap 115 consisting of a silicon lid into which patterns 120 are etched to form an individual diffracting optical element is also provided. Two possible approaches to implementing this diffractive optical element (DOE) are known as amplitude modulation and phase modulation respectively. In the case of amplitude modulation, the surface pattern consists of areas that allow transmission of the radiation and areas that block the radiation. In the case of phase modulation the pattern consists of height variations on the surface that effectively modify the relative phase of the radiation as a function of the relative height differences of the pattern. In this illustrated embodiment the pattern is provided on an interior surface 135 of the cap, but it will be appreciated that it could also be provided on an exterior surface 140. It will also be appreciated that the pattern, whose geometry is exaggerated for ease of viewing, includes a plurality of ridges 150 whose distance apart and depth is related to the wavelength of light with which the optical element is being used. The cap is typically formed in a second silicon wafer or capping die. This pattern 120 defined in the diffracting optical element cap 115 is capable of focusing incident radiation 125 of a given frequency onto a specific plane of the sensor or onto a specific point on the sensor or of focusing different frequencies onto different points. The cap 115 is bonded to the first wafer using a bond or seal material 130 and the bonding defines a sealed cavity 145, which can be at a different pressure than ambient pressure, typically a lower pressure. Alternatively the sealed nature of this cavity and the manufacturing process allows the ambient gas within the cavity to be different to air, for example we could use Xenon which has a lower thermal conductivity than air or some other gas. Although a silicon cap is substantially opaque to incident light in the visible spectrum and therefore it may be considered that it occludes the light from impinging on the sensing element within, it will be appreciated that silicon allows a transmission of light in the infra-red frequencies of the EM spectrum and therefore for this application, the provision of an IR sensor, it is a suitable material. FIG. 2 shows an example of an assembled sensor device from which it will be seen that the sensing element is covered by the cap provided above it.

Figure 3:
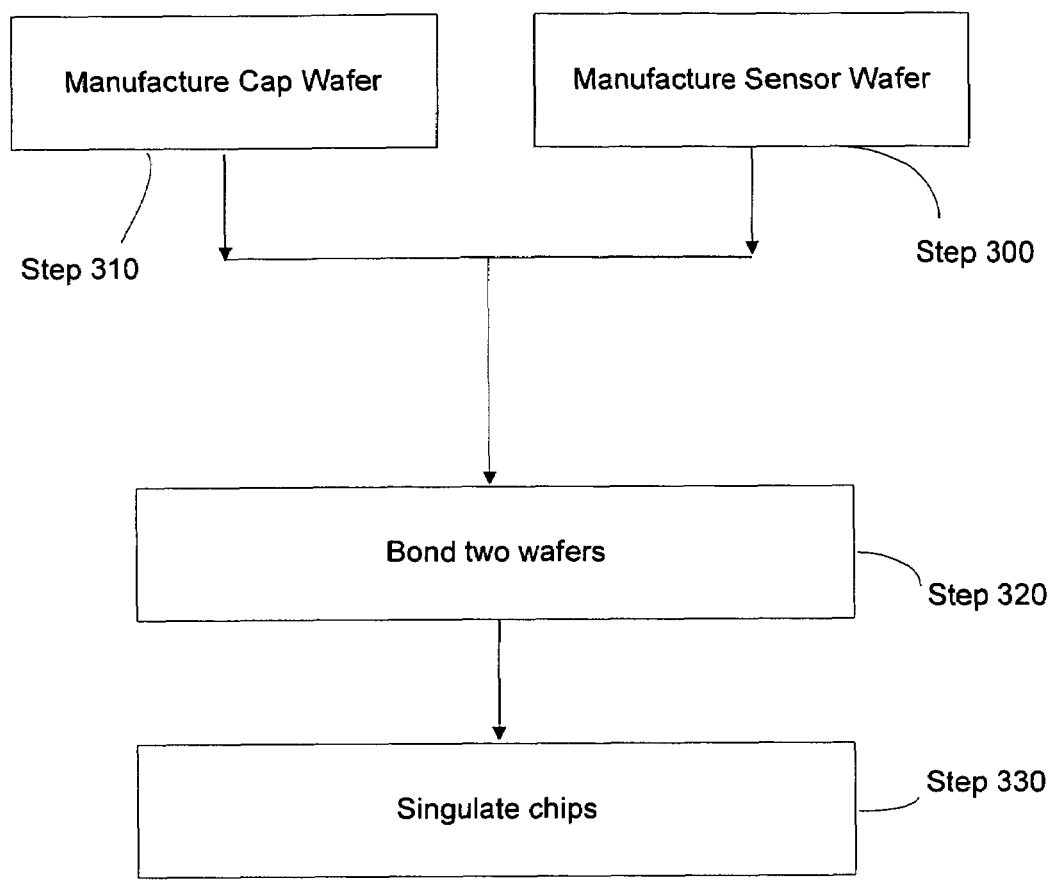
FIG. 3 is an example of a methodology that may be employed for forming the sensor of FIG. 1.

A typical process flow for manufacture of the sensor is shown in FIG. 3. Firstly, the sensor wafer 110 is manufactured using techniques that will be well known to those in the art (Step 300). The capping wafer is also manufactured (Step 310) separately. The manufacture of this capping wafer includes the etching of a desired pattern on either or both of the outer 140 or inner surface 135 of the cap. An anti-reflective coating may additionally be added to the cap surface, either inner or outer. Once the desired components on each of the two wafer substrates are provided, the wafers may be brought together so as to be bonded (Step 320). Ideally, this bonding is achieved under vacuum conditions. Once the two wafers have been brought together individual chips may be singulated or defined within the total area of the wafers by removing the areas of the second wafer that do not define the cap (Step 330). In this manner a plurality of individual chips or sensors may be provided in one process flow.

Figure 4A:
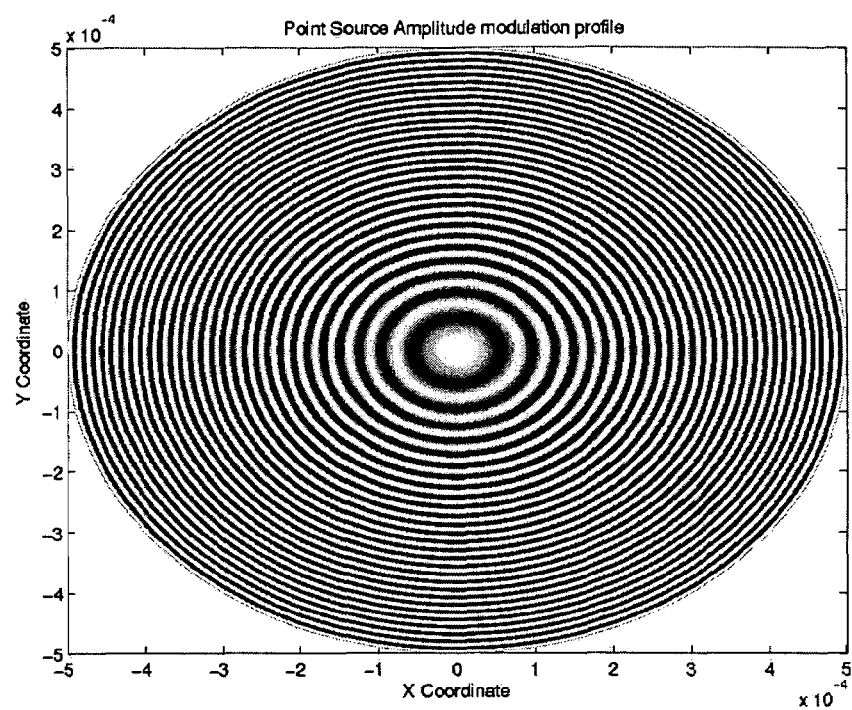
FIG. 4A is an example of a first pattern that may be used to define an optical element in accordance with the teachings of the present invention.
Figure 4B:
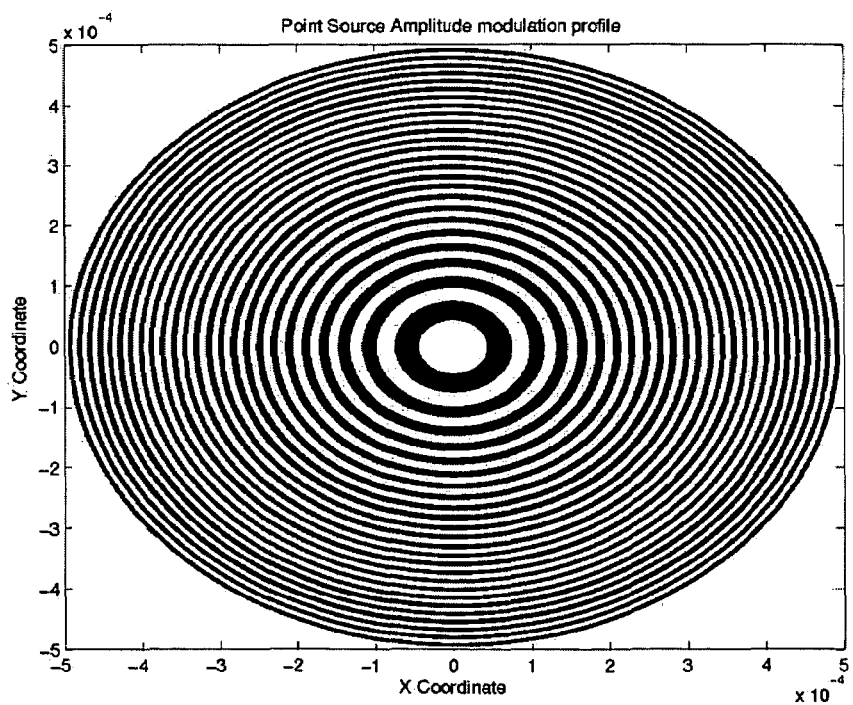
FIG. 4B is an example of a second pattern that may be used to define an optical element in accordance with the teachings of the present invention.
Figure 4C:
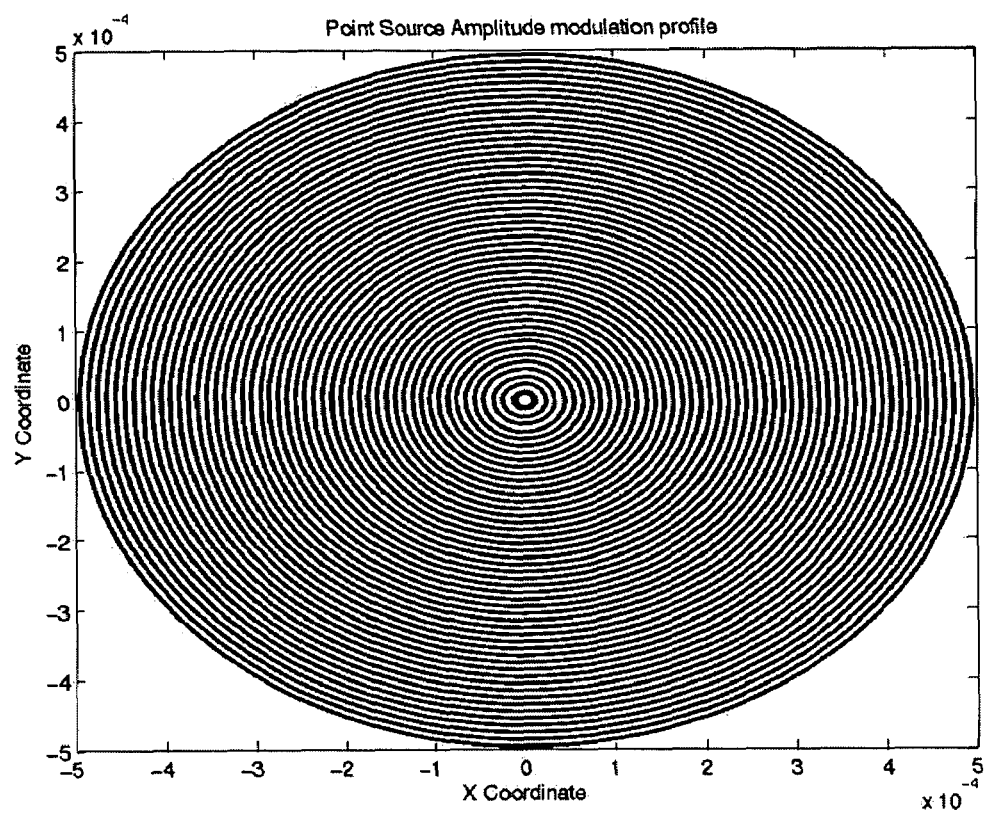
FIG. 4C is an example of a third pattern that may be used to define an optical element in accordance with the teachings of the present invention.

It will be understood that the nature of the pattern defining the optical element will effect how the sensor performs. FIG. 4 shows examples of pattern types, which can be implemented using either an amplitude modulation or a phase modulation approach, which may be used to define diffractive optics in the sensor cap. The example of FIG. 4A is optimised for a focusing of parallel input light of wavelength 10 micrometers down to a focal plane 300 micrometers away using a sinusoidal variation in the height of the diffractive optical element for a phase modulation approach. The relative heights of the sinusoid are represented by the gray scale variation in the pattern, for an amplitude modulation approach the gray scale would represent the transmission efficiency of the pattern. The example of FIG. 4B is designed for a focusing of parallel input light of wavelength 10 micrometers down to a focal plane 370s micrometer away but in this case the black and white pattern represents a single step height variation to implement the grating of the phase modulated diffractive optical element rather than a sinusoidal variation. The example in FIG. 4C also uses a single step height variation to implement the diffractive optical element but in this case it is designed to focus parallel input light of wavelength 10 um down to a focal plane 10 micrometers away. It will be understood that these three examples are illustrative of the type of pattern that may be used and that different design requirements regarding the control of the focus plane or independent control over different wavelength components within the incident radiation are also possible with this approach and are covered by this invention. These examples, consisting of black and white circles in FIG. 4B and 4C can represent either a transmission pattern or a phase modulation pattern that focuses the light, but suffer in that losses in transmission are also achieved. It will be appreciated however that the design of the pattern may be optimised to achieve lower loss criteria such as for example introducing curved side walls in the ridge features defining the grating, as represented by the grayscale diagram of FIG. 4A.

The cap provided by the present invention is advantageous in a number of aspects. It serves to: 1) protect the membrane during subsequent handling, 2) it also provides a housing for the sensing membrane that can be evacuated during manufacture, and 3) it can be patterned and etched in such a way as to focus the incident infra red radiation onto a single point to amplify the signal or onto an array to create an image of a scene. In particular, the pattern can be such as to implement an optical element (i.e. conventional refractive or fresnel lens) or in the preferred embodiment a diffractive optical element. The creation of an optical element for this application is advantageous in that the lens can be implemented in silicon rather than the more exotic (and expensive) materials required heretofore for an infrared refractive lens. The advantage resulting from the use of diffractive optics in the silicon cap is that the lenses can be patterned and etched at the wafer batch level using well established processes and bonded to the sensor wafers, resulting in a cost effective lens compared to the refractive lens technologies heretofore employed. This approach may be applicable to other electromagnetic radiation sensors in addition to the infrared application described here. For example the cap could be made of quartz or in some cases standard glasses such as pyrex or possibly sapphire if the sensor is to be used for applications other than IR sensors.

Figure 5:
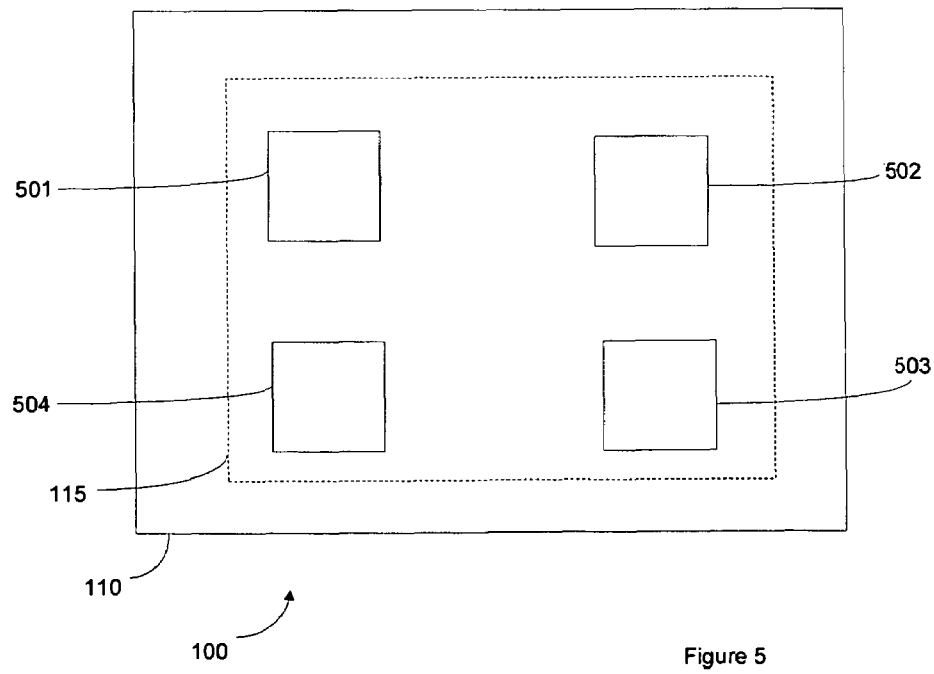
FIG. 5 is a plan schematic showing an example of a sensor including multiple sensor elements in accordance with an illustrative embodiment of the invention.

In some applications it may also be useful to be able to use the lens/cap configuration to focus different wavelengths within the incoming radiation onto different sensors enclosed by the cap. FIG. 5 is a schematic illustration of one such example where four sensing elements 501, 502, 503, 504 are provided within the same cap arrangement. It will be appreciated that suitable designing of the lens arrangement may allow for an optimisation of the sensor to focus one particular wavelength while defocusing (rejecting) others. This would allow individual intensity measurement of different wavelength components within the infrared radiation, a capability that could be very useful in for example gas analysis such as alcohol breath samplers where there is a desire to monitor the level of ethyl alcohol in the breath of a person. As alcohol has specific absorbance peaks in the IR spectrum, the focusing of radiation coincident with these peaks onto specific ones of the sensors elements 501, 502, 503, 504 provided in an array below the cap will enable the discrimination of any change in the intensity of the radiation at those specific frequencies therefore serve as an indicator of alcohol present in a sample. As each of the sensor elements is configured to react to incident radiation of a suitable frequency, when that radiation is incident on the individual sensors, an analysis of the performance of each of the sensor elements indicates the presence or absence of the material for which it is designed to react to providing a gas wavelength signature of the gas being analysed.

Figure 6:
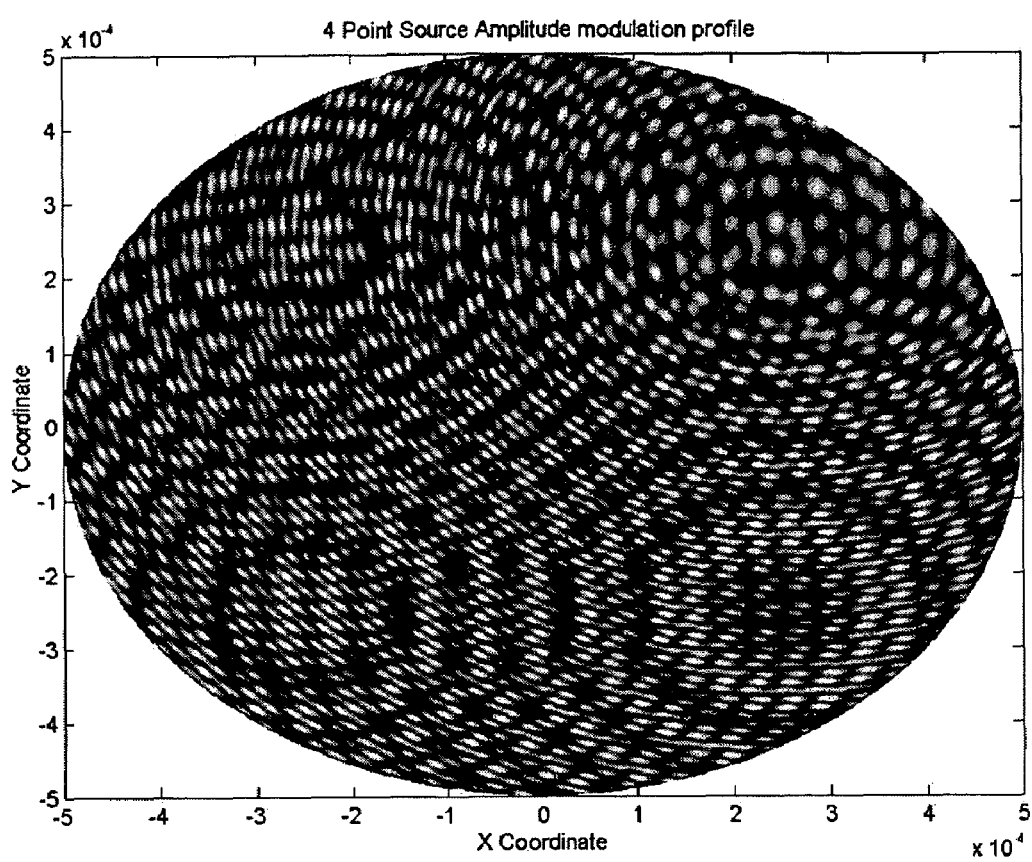
FIG. 6 is an example of a pattern that may be used to define an optical element suitable for use with multiple sensor elements in FIG. 5 in accordance with the teachings of the present invention.

FIG. 6 is an example of a diffractive optical element (DOE) design using an amplitude modulation approach that could be used in combination with the sensor arrangement in FIG. 5 to focus each one of four distinct wavelengths within the incident radiation onto one of the four sensing elements 501, 502, 503, 504 that are shown in FIG. 5.

Although not shown, it will be appreciated that the structure of the present invention may be further modified to include a second lens arrangement provided over the optical element so as to effect a compound lens effect. Such an arrangement may be suitable for applications such as increasing magnification, increasing the field of view, increased resolution and improved optical filtering.

It will be understood that the techniques of the present invention provide an efficient way to provide an IR sensor array such as for example a 60×60 array. Such configurations are desirable for applications such as IR imaging where a sensor array of the present invention may be used to replace conventional IR arrays. Current IR arrays do not have the lens and sensor array integrated in a low cost unit as provided for by this invention. Current conventional IR arrays provide a vacuum package with an IR transparent window or lens in the package rather than the wafer level solution described by this invention.

Another application for the integrated senor element/lens cap configuration of the present invention is where depth of field analysis is required. By configuring the lens suitably, it is possible to focus light from two different distances onto separate sensor elements within the cap. This enables discrimination as to the origin of the heat source, for example is it a planar metal plate or a 3-Dimensional human torso. Such applications may include discriminatory deployment sensors for use in for example air bag deployment arrangements.

The dimensions of a sensor in accordance with the present invention are typically of the order of micro to millimetres. For example when targeting radiation of a wavelength of 10 micrometers, a cap may be dimensioned to have a collection area of about 1 mm$^2$ and be of a height of about 160 micrometers above the sensor element. These dimensions are however purely for illustrative purposes only and it is not intended to limit the present invention to any one set of dimension criteria.

The words upper, lower, inner and outer are used for ease of explanation so as to illustrate an exemplary illustrative embodiment and it in not intended to limit the invention to any one orientation. Similarly, the words comprises/comprising when used in this specification are to specify the presence of stated features, integers, steps or components but does not preclude the presence or addition of one or more other features, integers, steps, components or groups thereof. Furthermore although the invention has been described with reference to specific examples it is not intended to limit the invention in any way except as may be deemed necessary in the light of the appended claims, and many modifications and variations to that described may be made without departing from the spirit and scope of the invention.

The invention claimed is:

1. A sensor having at least one sensor element formed in a first substrate and at least one diffractive optical element formed in a second substrate, the first and second substrates being configured relative to one another such that the second substrate forms a cap over the at least one sensor element, the cap having side walls, the at least one optical element being formed in the cap, the side walls being bonded to the first substrate using a bond material provided on the bottom of the walls such that the cap defines a cavity around the at least one sensor element, the defined cavity being shared by the cap and the at least one sensor element and wherein the at least one optical element is configured to focus incident radiation on the cap to at least one of the least one sensor elements located below.

2. A sensor having at least one sensor element formed in a first substrate and at least one diffractive optical element formed in a second substrate, the first and second substrates being configured relative to one another such that the second substrate forms a cap over the at least one sensor element, the cap having side walls, the at least one optical element being formed in the cap, the side walls being bonded to the first substrate using a bond material provided on the bottom of the walls such that the cap defines a cavity around the at least one sensor element, the height of the side walls being grater than the thickness of the bond material, the defined cavity being shared by the cap and the at least one sensor element and wherein the at least one diffractive optical element is configured to selectively focus radiation of predetermined wavelengths incident on the cap to at least one of the least one sensor elements located below.

3. The sensor as claimed in claim 1 or claim 2 wherein the first and second substrates are provided in silicon.

4. The sensor as claimed in claim 1 or claim 2 wherein the at least one sensor element is an infra-red sensor element.

5. The sensor as claimed in claim 1 or claim 2 wherein ambient conditions and composition within the cavity can be specified.

6. The sensor as claimed in claim 5 wherein the cavity is provided at a pressure lower than ambient pressure.

7. The sensor as claimed in claim 5 wherein the cavity is populated with a gaseous composition selected for the application with which the sensor is to be used.

8. The sensor as claimed in claim 7 wherein the gaseous composition comprises a gas having a thermal conduction less than the thermal conduction of nitrogen.

9. The sensor as claimed in claim 1 or claim 2 wherein the at least one optical element is formed in an inner surface of the cap, adjacent to the cavity.

10. The sensor as claimed in claim 1 or claim 2 wherein the at least one optical element is formed in an outer surface of the cap, remote from the cavity.

11. The sensor as claimed in claim 1 or claim 2 wherein optical elements are formed in an outer surface of the cap, remote from the cavity and an inner surface of the cap, adjacent to the cavity, the combination of the optical elements adjacent to and remote from the cavity forming a compound lens.

12. The sensor as claimed in claim 1 or claim 2 wherein a plurality of sensor elements are formed and the optical element is configured to selectively guide radiation of specific wavelengths to preselected ones of the plurality of sensor elements.

13. The sensor as claimed in claim 1 or claim 2 comprising a second cap, the second cap being orientated over the first cap, the second cap including an optical element, the optical elements of the first and second caps being configured to provide a compound lens.

14. A sensor array including a plurality of sensors, each of the sensors having a sensor element formed in a first substrate and diffractive optical element formed in a second substrate, the first and second substrates being configured relative to one another such that the second substrate forms a cap over the sensor element, the cap having cap walls which are bonded to the first substrate using a bonding material provided on the bottom of the cap walls to define a cavity about the sensor element, the optical element being formed in the cap which shares the cavity with the sensor element, the optical element being configured to focus incident radiation on the cap onto at least one of the sensors, the sensor array being configured to define an image plane.

15. A discriminatory sensor configured to provide a signal on determination of a predefined three dimensional shape being sensed, the sensor including a first sensor element configured to provide a signal on sensing an object a first distance from the sensor and a second sensor element configured to provide a signal on sensing an object a second different distance from the sensor, each of the first and second sensor elements including at least one sensing element formed in a first substrate and at least one optical element formed in a second substrate, the first and second substrates being configured relative to one another such that the second substrate forms a cap over the at least one sensing element, the cap having cap walls which are bonded to the first substrate using a bonding material provided on the bottom of the cap walls to define a shared cavity about the sensor element, the at least one optical element being formed in a lid portion of the cap and being configured to focus incident radiation on the cap to at least one sensing element of the at least one sensing elements.

16. The discriminatory sensor of claim 15 wherein the at least one sensing element of each of the first and second sensor element are formed in the same substrate.

17. The discriminatory sensor of claim 15 wherein the object is a human torso.

18. A gas analyser including at least one sensor element formed in a first substrate and at least one optical element formed in and from a second substrate, the first and second substrates being configured relative to one another such that the second substrate forms a cap over the at least one sensor element, the cap having cap walls which are bonded to the first substrate using a bonding material provided on the bottom of the cap walls to define a shared cavity about the sensor element, the at least one optical element being located in a lid of the cap and being configured to focus incident radiation on the cap to at least one of the at least one sensor elements, the incident radiation guided having a wavelength indicative of the presence of a specific gas.

19. The gas analyser of claim 18 including a plurality of sensor elements and a plurality of associated optical elements therefore, each of the combined sensor elements and optical elements being configured for specific wavelength analysis such that the output of the plurality of sensor elements may be used to provide a gas wavelength signature spectrum.

20. A method of forming a sensor, the method including the steps of:

forming at least one sensor element in a first substrate, forming at least one diffractive optical element in a second substrate, the second substrate defining a cap having cap walls, providing a bonding material on the bottom of the cap walls, the height of the cap walls being greater than the thickness of the bonding material, bonding the first and second substrates together using the bonding material such that the second substrate provides a cap over and defines a shared cavity for the sensor element and the cap, and the optical element is configured to focus incident radiation of predetermined wavelengths incident on the cap onto at least one of the at least one sensor elements.

21. A sensor array including a plurality of sensors, each of the sensors having a sensor element formed in a first substrate and a diffractive optical element formed in a second substrate, the first and second substrates being configured relative to one another such that the second substrate forms a cap over the sensor element, the cap having cap walls which are bonded to the first substrate using a bonding material provided on the bottom of the cap walls to define a cavity about the sensor element, the height of the cap walls being greater than the thickness of the bonding material, the optical element being formed in the cap which shares the cavity with the sensor element, the optical element being configured to focus incident radiation of predetermined wavelengths incident on the cap onto at least one of the sensors, the sensor array being configured to define an image plane.

* * * * *